United States Patent [19]

Nakamura

[11] Patent Number: 5,767,542
[45] Date of Patent: Jun. 16, 1998

[54] MATCHING PARASITIC CAPACITANCES AND CHARACTERISTICS OF FIELD EFFECT TRANSISTORS

[75] Inventor: Katsufumi Nakamura, Cambridge, Mass.

[73] Assignee: Analog Devices, Inc., Norwood, Mass.

[21] Appl. No.: 654,348

[22] Filed: May 28, 1996

[51] Int. Cl.[6] .................... H01L 27/108; H01L 27/01; H01L 29/01
[52] U.S. Cl. .................... 257/296; 257/350; 257/386; 257/503; 257/516; 257/300; 257/394; 257/547
[58] Field of Search .................... 257/296, 300, 257/304, 326, 327, 386, 394, 274, 503, 516, 547

[56] References Cited

U.S. PATENT DOCUMENTS 5,252,848  10/1993  Adler et al. .................... 257/328
5,521,419  5/1996  Wakamiya et al. .................... 257/394

OTHER PUBLICATIONS

"Bipolar and MOS Analog Integrated Circuit Design" Section 8.6; Alan B. Grebene, Micro–Linear Corp.; Sunnyvale, California A Wiley–Interscience Publication, John Wiley and Sons, 1984; pp 415–449.

"CMOS Video Filters Using Switched Capacitor 14–MHz Circuits"; Kazuyuki Matsui, et al. IEEE Journal of Solid-State Circuits; vol. sc–20, No. 6, Dec., 1985; pp. 1096–1102.

A Pipelined 9–Stage Video–Rate Analog–To–Digital Converter; Stephen H. Lewis, et al., AT&T Bell Labs IEEE 1991 Custom Integratd Circuits Conference.

"A 12-bit 1–Msample/s Capacitor Error–Averaging Pipeline A/D Converter", Bang–Sup Song, et al., IEEE Journal of Solid–State Circuits, vol. 23, No. 6, Dec., 1988; pp. 1324–1333.

*Primary Examiner*—Tom Thomas
*Assistant Examiner*—Fetsum Abraham
*Attorney, Agent, or Firm*—Wolf, Greenfield & Sacks, P.C.

[57] ABSTRACT

A CMOS layout enables the matching of an intentionally created parasitic capacitance to an existing parasitic capacitance, for example, a gate-to-drain capacitance of a MOSFET, with a high degree of precision. This precise matching allows a differential pair of MOSFETs acting as the input of an amplifier to have intentionally created capacitances (that match the parasitic gate-to-drain capacitances) cross-coupled between the inputs and the outputs of the differential pair. This cross-coupling of matching capacitances effectively cancels the bandwidth reducing effect of the gate-to-drain capacitances of the differential pair. The layout provides for the interdigitation of the gates of the differential pair, with each input transistor comprising at least two transistors connected together to form a single input transistor. Each of these input transistors, in turn, has a gate placed near the drains of the at least two (connected) devices, thus forming intentionally created parasitic capacitances between the gate and each of the two drains. In this arrangement, the two created parasitic capacitance match the two gate-to-drain parasitic capacitances with a high degree of precision due to the proximity of the devices and the lack of interconnections between them. Also, by using mirrored symmetry in the layout, the effects of gradients in the materials forming the devices are averaged out for each device.

20 Claims, 8 Drawing Sheets

MATCHING PARASITIC CAPACITANCES AND CHARACTERISTICS OF FIELD EFFECT TRANSISTORS

FIELD OF THE INVENTION

The present invention relates generally to layouts of field effect transistors (FETs) and, more particularly, to layouts of FETs that provide several devices that substantially match one another. The layout and method of the invention enable the intentional creation of parasitic capacitances that substantially match the gate-to-drain or gate-to-source capacitances of FETs.

BACKGROUND OF THE INVENTION

Metal oxide semiconductor field effect transistors (MOSFETs) commonly are used in amplifier circuits. When an FET is properly biased, applying a signal to the gate of the FET results in the applied signal being amplified by a gain-factor alpha ($\alpha$) and provided at the drain node of the device. The gain-factor $\alpha$ is equal to the transconductance (gm) of the FET multiplied by the output impedance of the circuit ($r_{out}$), i.e., $\alpha = gm * r_{out}$. An example of a simple FET amplifier is shown at 20 in FIG. 1.

A properly biased FET, i.e., an FET operating in its active region, has at least two sources of parasitic input capacitance: (1) the gate-to-drain capacitance ($C_{GD}$), which is (approximately) proportional to the width of the transistor channel, and (2) the gate-to-source capacitance ($C_{GS}$), which is (approximately) proportional to the area of the transistor channel, i.e., channel length * channel width. In an unbiased state, however, $C_{GD}$ and $C_{GS}$ of an FET are approximately equal. Capacitors 22 and 24 in FIG. 1 represent $C_{GS}$ and $C_{GD}$, respectively, of (presumptively) properly biased transistor M3. The presence of these capacitances can have deleterious effects on the performance characteristics, e.g., bandwidth, of circuits (such as amplifier circuit 20) using such FETs.

Since $C_{GS}$ is proportional to the area of the transistor channel (rather than just the channel width, as is $C_{GD}$), $C_{GS}$ commonly is the dominant factor in determining the total input parasitic capacitance ($C_{PI}$). Because capacitor 24 (representing $C_{GD}$) effectively is coupled between the output and the input of amplifier 20, however, its value is Miller-multiplied by the gain-factor $\alpha$. Specifically, the effective capacitance value of $C_{GD}$ ($C_{GD(EFFECT)}$) is determined by the following equation: $C_{GD(EFFECT)} = C_{GD} * gm * r_{out}$. Therefore, the total capacitance value of $C_{PI}$ is determined by the equation: $C_{PI} = C_{GS} + (C_{GD} * gm * r_{out})$. Based on this equation, for large values of gm (or $r_{out}$), $C_{GD(EFFECT)}$ can become a significant component of $C_{PI}$.

An example of a differential amplifier using FETs as input devices is shown at 36 in FIG. 2. Differential amplifier 36 receives an input signal at opposite polarity input nodes INP and INM and provides an amplified differential output signal between output nodes OUTP and OUTM. Transistors M1 and M2 are biased by current sources 32 and 33, respectively, and the differential pair is driven by current source 34 connected to the common-source "tail" node of transistors M1 and M2. Capacitors 25 and 26 represent the gate-to-drain capacitances ($C_{GD}$) of transistors M1 and M2, respectively. Also, for the reason explained below, differential amplifier circuit 36 includes capacitor 28, which is connected between the drain node of transistor M1 and the gate of transistor M2, as well as capacitor 30, which is connected between the drain node of transistor M2 and the gate of transistor M1.

It is known that by properly sizing capacitors 30 and 28 so that their capacitance values match the gate-to-drain capacitances ($C_{GD}$) of transistors M1 and M2 (shown as capacitors 25 and 26), respectively, the effect of the gate-to-drain capacitances ($C_{GD}$) of transistors M1 and M2 will be substantially negated. That is, since capacitors 30 and 28 are connected to opposite polarity inputs and outputs of a differential pair of transistors, they effectively introduce a negative capacitance into the signal path, which negative capacitance serves to cancel the positive capacitance values of (representative) capacitors 25 and 26. But, if the capacitance values of capacitors 30 and 28 do not substantially match the $C_{GD}$ values of transistors M1 and M2, an imprecise cancellation of the $C_{GD}$ values will result. Such an imprecise cancellation of the $C_{GD}$ values can, in turn, cause a reduction in the performance characteristics, e.g., bandwidth, of the circuit. In fact, if the capacitance values of (representative) capacitors 30 and 28 are substantially greater than the values of (representative) capacitors 25 and 26, respectively, the negative capacitance values of capacitors 30 and 28 will dominate the value of $C_{PI}$, thus causing the circuit to become unstable.

One way to create capacitors 28 and 30 is to appropriately size a separate (unbiased) FET and connect its source node to its drain node. A transistor connected in this manner commonly is referred to as a dummy transistor. Such a dummy transistor has a total parasitic capacitance ($C_{PD}$) between its gate and its source-drain connection that is defined by the equation: $C_{PD} = C_{GD} + C_{GS}$, where $C_{GD}$ and $C_{GS}$ are approximately equal (since the transistor is in an unbiased state). FIG. 3 shows the differential circuit 36 with a pair of dummy transistors M2D and M1D used as capacitors 28 and 30 (of FIG. 2). By sizing dummy transistors M2D and M1D to be one-half the size of transistors M1 and M2, respectively, the parasitic capacitances of dummy transistors M2D and M1D will be approximately equal to the gate-to-drain capacitances ($C_{GD}$) of input transistors M1 and M2, respectively. Also, as with any differential pair of transistors, it is important that the sizes of input transistors M1 and M2 substantially match, as well.

The known methods for proportionally sizing FETs (e.g., at a two-one ratio), however, produce devices that do not have precisely matching parasitic capacitances. At a time when FET sizes were much larger (e.g., substantially larger than 1 micron) and were operated at lower frequencies, such capacitance mismatches had less of an effect on a circuit's performance since the mismatches were small in relation to the device sizes and did not substantially limit the bandwidth of the slower circuits. Currently, however, with sub-micron device sizes and very fast circuits, even slight mismatches in parasitic capacitances (when using a parasitic capacitance canceling technique as described previously) can have substantial adverse effects on a circuit's performance.

Therefore, a need exists for an FET transistor layout wherein, even with small device sizes, a parasitic capacitance of an FET is closely matched by an intentionally created parasitic capacitance on the same substrate as the FET.

SUMMARY OF THE INVENTION

In the invention, the parasitic capacitance of an FET is matched to a high degree of precision by creating a capacitance at a position (i.e., a physical location) near the source of the parasitic capacitance.

According to one embodiment of the present invention, a semiconductor substrate has an FET disposed thereon. A conductor other than the gate of the FET is situated physically near the source or the drain of the FET to create a capacitance between the conductor and the source or drain.

According to another embodiment, at least two FETs are disposed adjacent one another. A conductor is placed over a doped region of each of the two FETs thereby creating a capacitance between the conductor and each of the doped regions. According to another embodiment, the at least two FETs are coupled together to create a combination which acts as one FET.

According to yet another embodiment, two additional FETs are disposed in line adjacent the first two FETs and a capacitance is formed between a conductor other than the gates of the two additional transistors and a doped region of each of the additional transistors.

According to another embodiment of the invention, the transistors are arranged symmetrically so as to account for gradients in the profile of materials forming the transistors. According to yet another embodiment, the transistors are connected as a differential pair of input transistors with created capacitances cross-coupled between its inputs and outputs.

DETAILED DESCRIPTION OF THE INVENTION

Figure 1:
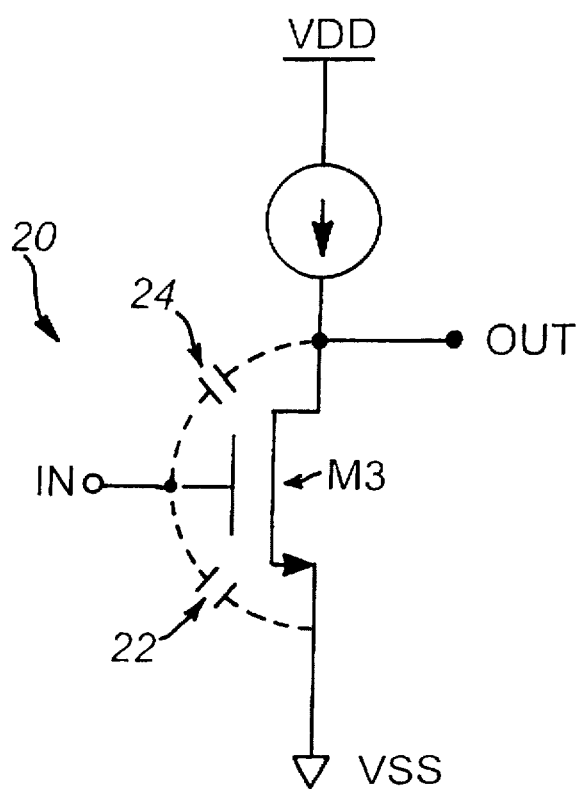
FIG. 1 is a schematic diagram of a simple prior art, single-ended FET amplifier circuit showing parasitic input capacitances.
Figure 2:
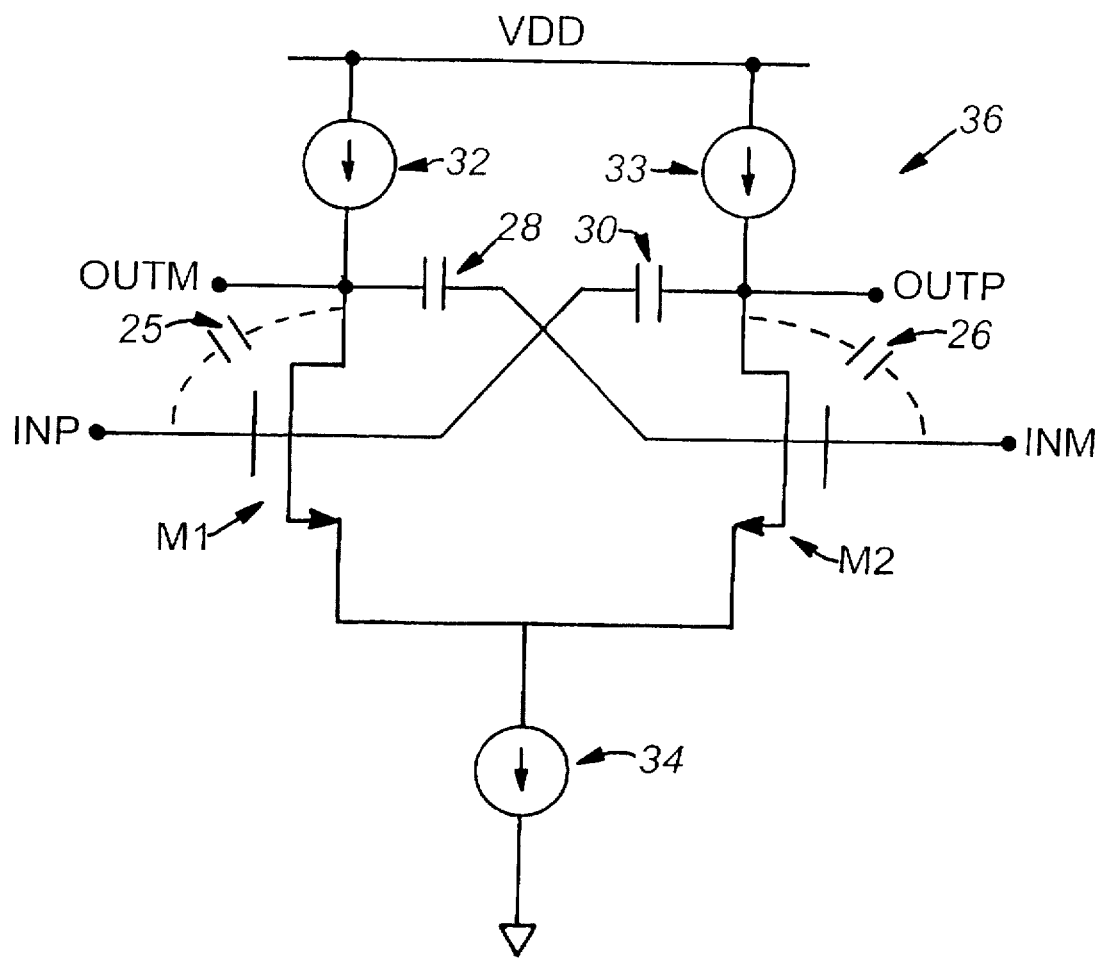
FIG. 2 is a schematic diagram of a prior art, differential FET amplifier circuit showing gate-to-drain and cross-coupled capacitances.
Figure 3:
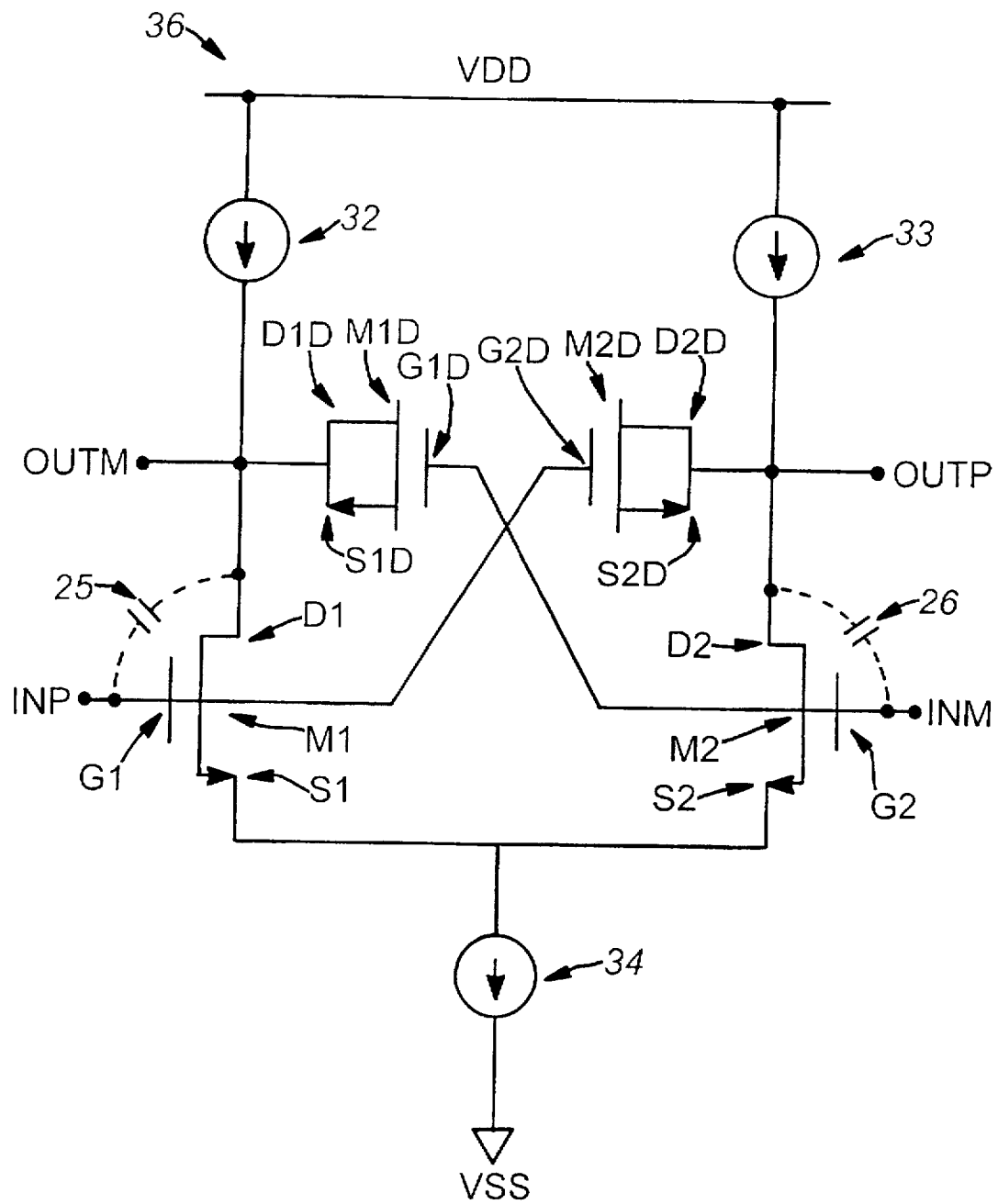
FIG. 3 is a schematic diagram of the prior art circuit of FIG. 2 wherein dummy FETs are used to create the cross-coupled capacitances.
Figure 4:
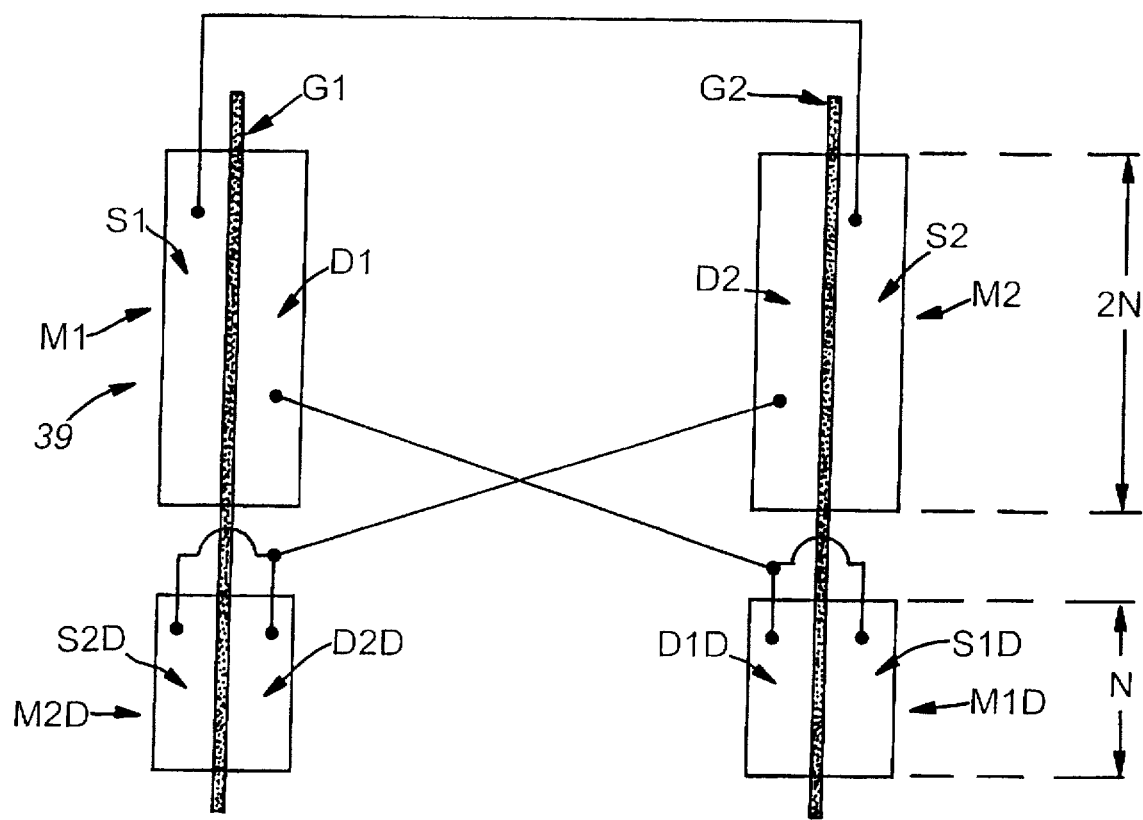
FIG. 4 is a top-view of a representation of an example of a semiconductor chip layout for implementing the circuit of FIG. 3.
Figure 5:
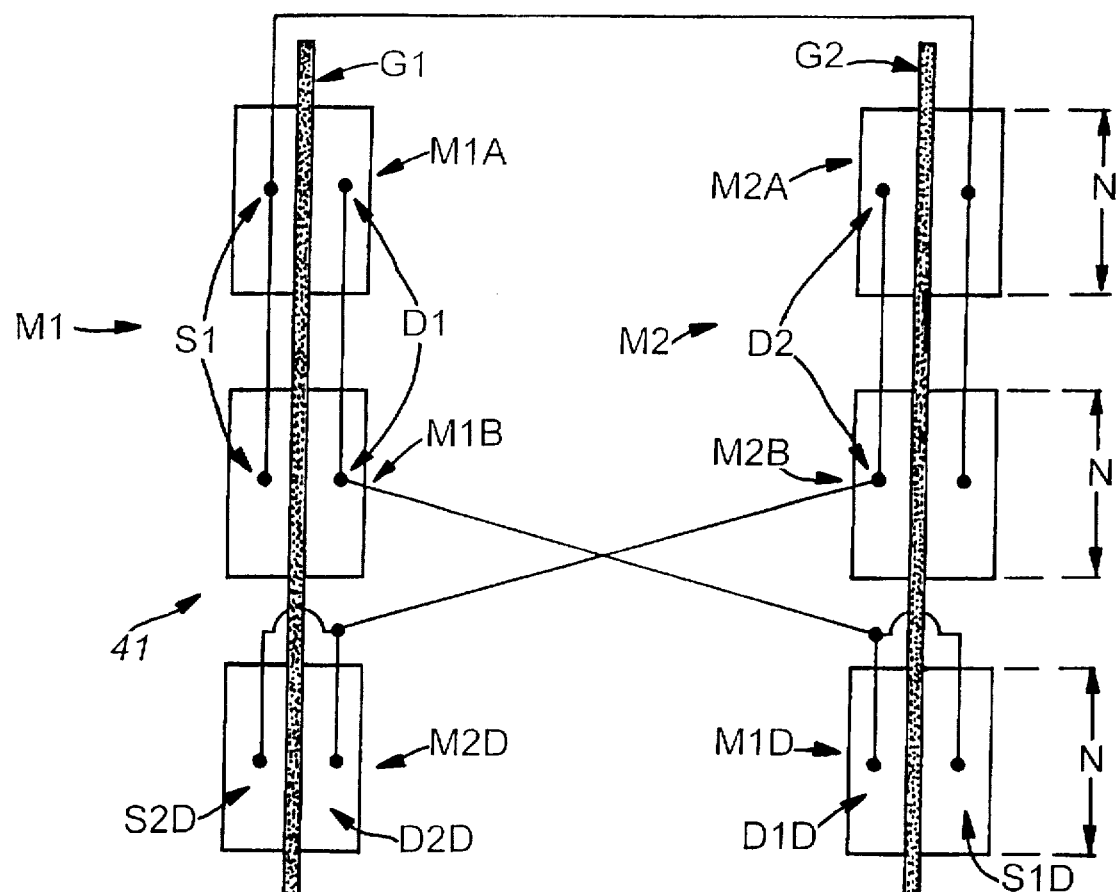
FIG. 5 is a top-view of a representation of another example of a semiconductor chip layout for implementing the circuit of FIG. 3.

Two layouts which can be used to size transistors at, for example, a two-to-one ratio are shown at 39 in FIG. 4 and at 41 in FIG. 5. Device layouts 39 and 41 correspond to the implementation of circuit 36 (shown in FIG. 3). In FIGS. 4 and 5, amplfier transistors (M1 and M2) and dummy transistors (M1D and M2D) are shown as they might appear from a top view of a semiconductor substrate. The channels (not shown) of the FETs are located directly beneath the gate conductors G1 and G2, the drain regions are labeled D1, D2, D1D or D2D, and the source regions are labeled S1, S2, S1D or S2D. If the substrate is of a p-type doping, then the drain and source regions will be of an n-type doping, and vice-versa. The channel widths and lengths of transistors M1, M2, M1D and M2D extend vertically and horizontally, respectively. Layouts 39 and 41 show the widths of the transistor channels as factors of a variable N, with each transistor having a channel width of either N or 2N.

Layout 39 of FIG. 4 uses channel widths for transistors M1 and M2 that are twice the width of the channels of transistors M2D and M1D, respectively. Such a layout results in M1 and M2 being twice the size of M2D and M1D, thereby matching the parasitic capacitances between the devices. In layout 41 of FIG. 5, with a similar result, transistor M1 is formed by interconnecting two individual transistors M1A and M1B, which each are the same size as transistor M2D. Similarly, in layout 41, transistor M2 is formed by interconnecting two individual transistors M2A and M2B, which are the same size as transistor M1D. In this manner, the sizes of M2 and M1 are made to approximate the sizes of dummy transistors M1D and M2D, respectively. In each of layouts 39 and 41, however, the transistors that are being matched are physically spaced apart from one another.

This geometric spacing of the transistors can result in differences between the device characteristics due to process variations in the production of the transistors. For example, the oxide thickness of the transistors might vary from device to device across the surface of a substrate, or the transistors may be unevenly doped (or doped by different diffusions). As such, geometrically spaced transistors can have significantly different parasitic capacitances. When used in a circuit such as circuit 36 (shown in FIG. 3), layouts 39 and 41 may result in the $C_{GD}$ parasitic capacitances not being canceled sufficiently to meet the operating requirements of a particular application.

Additionally, layouts 39 and 41 require significant interconnections between the devices forming transistors M1, M2, M1D and M2D. These interconnections introduce random parasitic capacitances between the conductors forming the interconnections and between the interconnection conductors and the device substrates. These parasitic interconnection capacitances introduce another hurdle that must be overcome in order to properly match parasitic capacitances between transistors. Again, mismatches in the parasitic capacitances of the devices in a circuit such as circuit 36 (shown in FIG. 3) can substantially hinder the circuit's performance.

The present invention provides an FET having a particular parasitic capacitance (between its gate and its drain) and an on-board created capacitance that substantially matches this gate-to-drain capacitance. The parasitic (gate-to-drain) capacitance of the transistor and the intentionally created capacitance are physically located adjacent one another on the same substrate, whereby geometrically spaced process variations and parasitic capacitances of interconnection wires do not compromise the precise matching of the two capacitance values.

Figure 6:
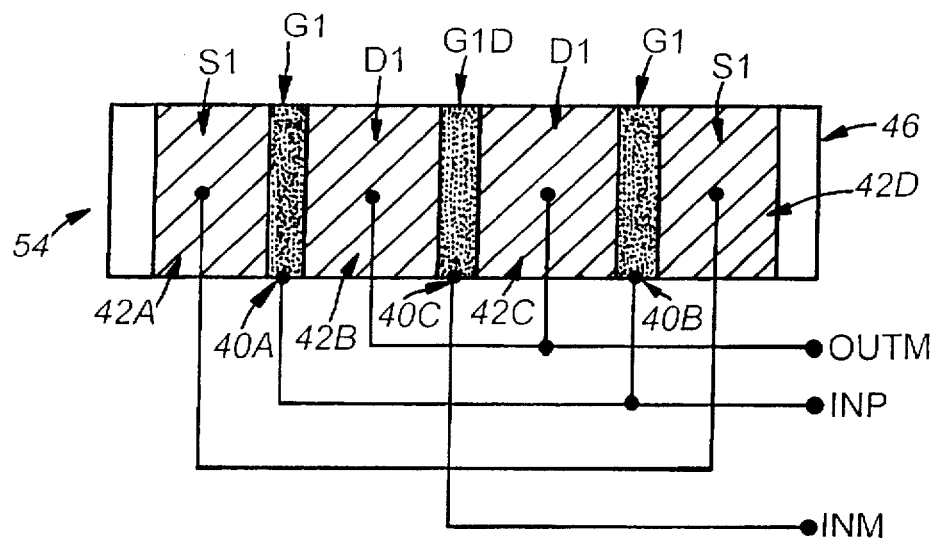
FIG. 6 is a top-view of an on-chip representation of one layout embodiment of the present invention.
Figure 7:
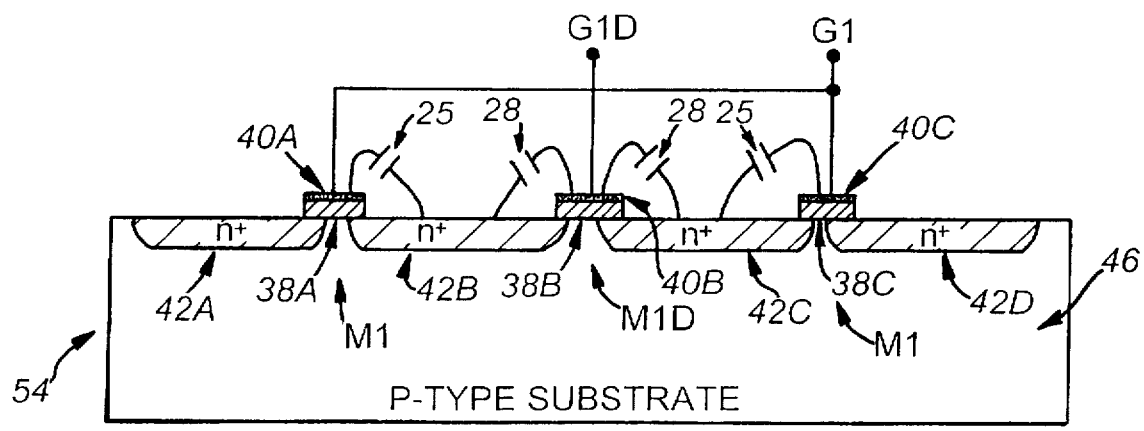
FIG. 7. is a sectional side-view of the on-chip representation of the layout embodiment of the invention shown in FIG. 6.

An embodiment of the invention is shown generally at 54 in FIGS. 6 and 7. This embodiment is a possible on-chip layout of transistors M1 and M1D of circuit 36 (shown in FIG. 3). Referring to FIGS. 6 and 7, four n+ regions 42A–42D are laterally spaced across the surface of a p-type substrate 46. These regions form the source node S1 and drain node D1 of transistor M1 (of FIG. 3), with two n+ regions 42A and 42D being used for node S1 and two n+ regions 42B and 42C being used for node D1. Gate G1 of transistor M1 and gate G1D of transistor M1D (of FIG. 3)

are formed with conductors (40A and 40B) and 40C, respectively, which are disposed atop oxide layers 38A–38C. By applying a voltage to gate G1, an n-type channel is formed between source node S1 and drain node D1, which channel has a conductance proportional to the voltage applied to gate G1. The parasitic gate-to-drain capacitance ($C_{GD}$)(represented by capacitors 25) of transistor M1 (shown in FIG. 3) is shown between gates G1 and drain nodes D1.

Referring still to FIGS. 6 and 7, capacitors 28 are drawn to represent the intentionally-created parasitic capacitance between gate G1D of dummy transistor M1D and drain nodes D1 of transistor M1. The capacitance value of each of (representative) capacitors 28 substantially approximates the capacitance value of one of (representative) capacitors 25. This substantial approximation results from the transistor's geometric proximity and orientation to the intentionally created capacitance, as well as the lack of interconnections required to create the capacitance. For reference purposes, several circuit nodes INP, OUTP and INM (which correspond to identically named circuit nodes in circuit 36 of FIG. 3) also are identified in FIG. 6.

Figure 8:
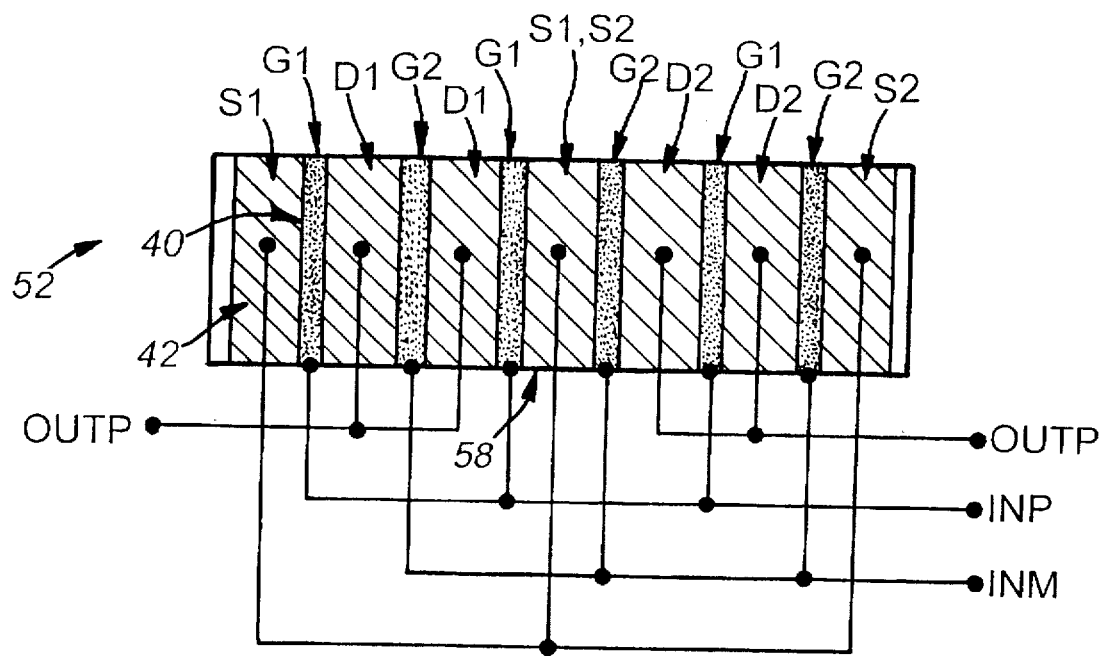
FIG. 8 is a top-view of an on-chip representation of another layout embodiment of the present invention.
Figure 9:
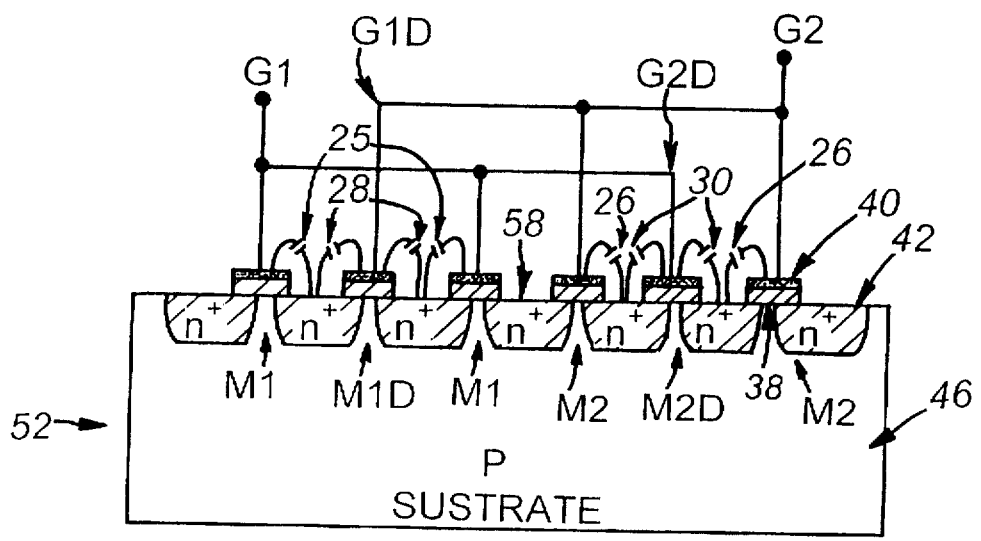
FIG. 9 is a sectional side-view of the on-chip representation of the layout embodiment of the invention shown in FIG. 8.

Referring now to FIGS. 8 and 9, another embodiment of the invention is shown. This embodiment includes a possible layout 52 of differential input transistors M1 and M2, as well as dummy transistors M1D and M2D (all of circuit 36 of FIG. 3), according to the present invention. The layout of transistor M1 and dummy transistor M1D in this embodiment is identical to the layout of these transistors in the embodiment shown in FIGS. 6 and 7. In the embodiment of FIGS. 8 and 9, however, transistor M2 and dummy transistor M2D are included on the same p-type substrate (adjacent transistor M1 and dummy transistor M1D). Transistors M2 and M2D are the same sizes as transistors M1 and M1D, respectively. One n+ region 58 is shared by the two source nodes S1 and S2. Gate nodes G1 and G2, source nodes S1 and S2, and drain nodes D1 and D2 are shown for transistors M1 and M2, respectively.

In addition to capacitors 25 and 28, representing the gate-to-drain capacitance of transistor M1 and the intentionally created parasitic capacitance of M1D, respectively, capacitors 26 and 30 are included in the embodiment of FIGS. 8 and 9. Capacitors 26 and 30 represent the gate-to-drain capacitance of transistor M2 and the intentionally created parasitic capacitance of dummy transistor M2D, respectively. Because transistors M1 and M2 are sized equally (and in close geometric proximity) on the same substrate, they will have substantially equivalent gate-to-drain capacitances. Therefore, since the capacitances of (representative) capacitors 25 and 26 are substantially equal, and the capacitances of capacitors 25 and 26 are substantially equal to the capacitances of (representative) capacitors 28 and 30, respectively, the total capacitances of capacitors 28 and 30 are substantially equal to the total capacitances of capacitors 26 and 25, respectively. In the differential configuration of layout 52, then, the cross-coupled (intentionally created) capacitances of dummy transistors M1D and M2D, will substantially negate the effect of the gate-to-drain capacitances of transistors M2 and M1, respectively.

Circuit nodes INP, INM, OUTP and OUTM (of circuit 36 of FIG. 3) also are shown in FIG. 8 for ease of reference. Layout 52 also can be repeated indefinitely across the surface of a substrate so as to increase the size of input transistors M1 and M2. This repetition may be accomplished by arranging several iterations of layout 52 end-to-end, with source nodes S1 and S2 (on each end of layouts 52) sharing common doped regions, or the iterations of layout 52 may be arranged parallel to one another.

In interconnecting multiple FET devices, however, care should be taken that the conductors forming the interconnections between the gates do not physically cross the conductors forming the interconnections between the sources or the drains. Such crossings of interconnections can cause unwanted parasitic capacitances in the circuit formed by the devices. Also, in addition to the more precise matching of the gate-to-drain parasitic capacitance, the parallel layout of this embodiment also provides another advantage. That is, by employing a layout having multiple devices in a repetitive pattern (such as the layout used in the embodiment of FIGS. 8 and 9), more closely matching devices are obtained since repetitive patterns tend to be less susceptible to process variations.

Figure 10:
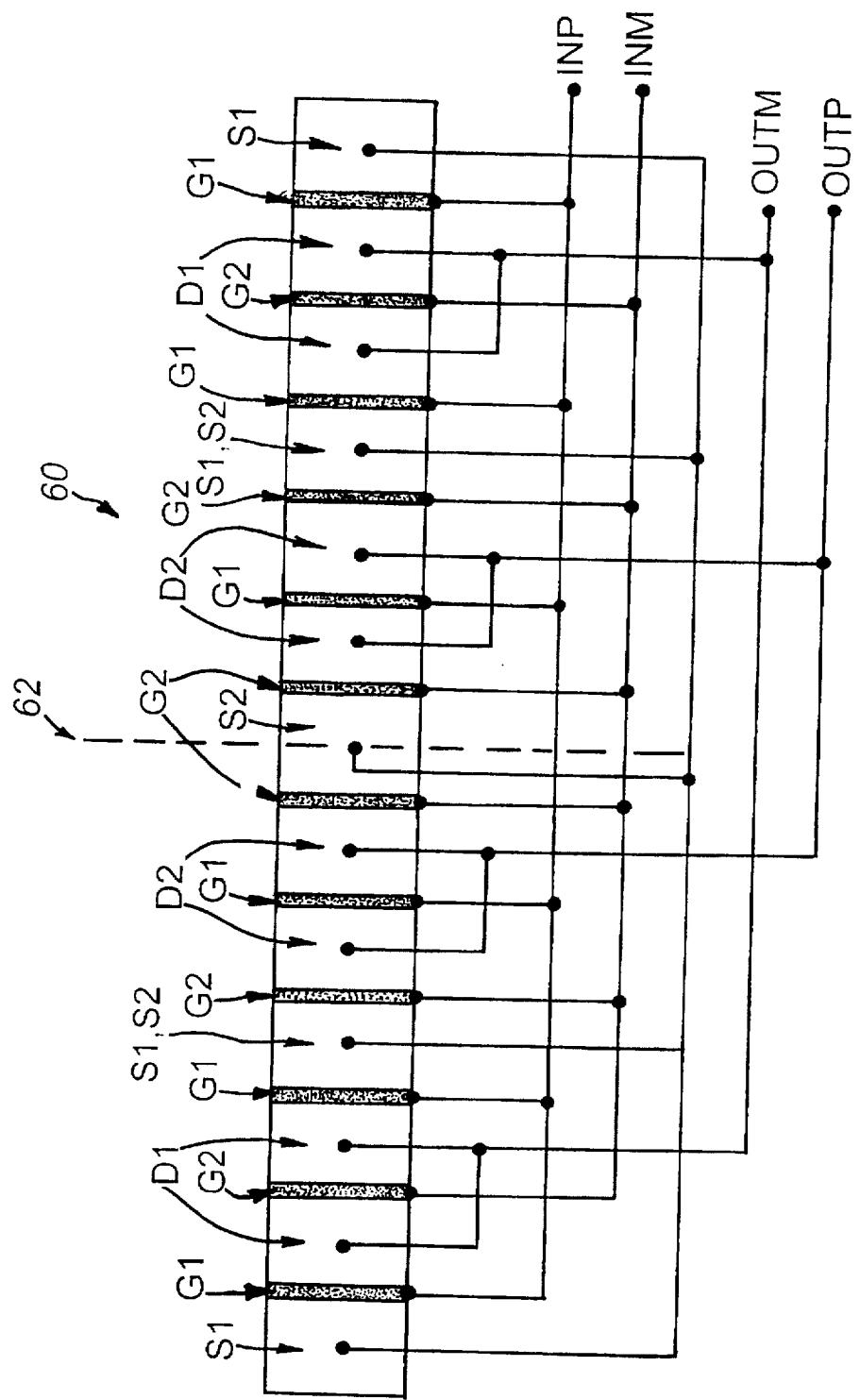
FIG. 10 is a top-view of an on-chip representation of yet another layout embodiment of the invention.

Referring finally to FIG. 10, another embodiment of the invention is shown. Again, gates G1 and G2, drain nodes D1 and D2, and source nodes S1 and S2 of this embodiment correspond to the gates, drains and sources of transistors M1 and M2, respectively, of circuit 36 (shown in FIG. 3). Dummy transistors M1 D and M2D are situated between the dual drains (i.e., the drains of the two transistors connected together to form each of transistors M1 and M2) of transistors M1 and M2 in a similar manner as in the embodiments shown in FIGS. 6–9. Device sizes in layout 60 also may be increased by interconnecting multiple devices, either end-to-end (with shared source regions) or in a parallel arrangement, as was explained in conjunction the description of layout 52 (shown in FIGS. 8 an 9). In fact, the embodiment shown in FIG. 10 is identical to the embodiment shown in FIGS. 8 and 9, except that the transistor layout is mirrored about symmetry line 62. An advantage of using such mirrored symmetry in a transistor layout is explained as follows.

Often, transistors are formed with characteristic gradients across one or more of their dimensions. For example, a gradient may be formed laterally across the length of a semiconductor device, wherein at least one characteristic of each transistor varies according to the lateral position of that transistor on the substrate. Such a lateral gradient may exist as to gate oxide thickness, gate size, n+ doped region size, or the doping concentration of the n+ doped regions (or of the p-type substrate). By using mirrored symmetry, however, gradient effects are diluted by periodically reversing the positions of the transistors on the chip. Thus, the mirrored symmetry of the embodiment shown in FIG. 10 helps to normalize the characteristics of each transistor and each dummy transistor on a particular substrate, creating not only a better match between the gate-to-drain capacitances of the transistors and the intentionally created parasitic capacitances, but also creating a better match between the characteristics of the transistors themselves. This superior matching capability, in turn, can greatly improve an FET circuit's performance.

It should be understood that while the embodiments of the present invention described herein employ n-channel FETs, p-channel devices alternatively could be employed so as to suit a particular design need. Similarly, while the capacitances being matched are described as gate-to-drain capacitances, the invention is not so limited. The matching of the gate-to-drain capacitance of a transistor is intended merely to exemplify the utility of the transistor layout disclosed, and the scope of the invention should be construed so as to apply to the matching of any parasitic capacitances of any transistors by using the transistor layout claimed herein and equivalents thereto, irrespective of the circuit in which the transistors are employed.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto.

What is claimed is:

1. A transistor layout, comprising:

a substrate of a first doping type;

a first field effect transistor (FET) including first and second regions of a second doping type physically located laterally adjacent, and slightly displaced from, one another in the substrate, one of the first and second regions serving as a source of the first FET and the other of the first and second regions serving as a drain of the first FET, and a first conductor serving as a gate of the first FET, wherein a first parasitic capacitance is formed between the first conductor and the second region due to a physical relationship therebetween; and a second conductor physically situated in close enough proximity to the second region such that a first created capacitance, which approximately matches the first parasitic capacitance, is formed between the second conductor and the second region, the second conductor not arranged in the layout so as to serve as a gate of an FET.

2. The transistor layout of claim 1, further comprising a second FET including third and fourth regions of the second doping type physically located laterally adjacent, and slightly displaced from, one another in the substrate, the third region physically being located laterally adjacent, and slightly displaced from, the second region of the first FET, one of the third and fourth regions serving as a source of the second FET and the other of the third and fourth regions serving as a drain of the second FET, and a third conductor serving as a gate of the second FET, wherein a second parasitic capacitance is formed between the third conductor and the third region due to a physical relationship therebetween; and wherein the second conductor physically is situated in close enough proximity to the third region such that a second created capacitance, which approximately matches the second parasitic capacitance, is formed between the second conductor and the third region.

3. The transistor layout as claimed in claim 1, wherein the second conductor physically is situated near the second region such that a physical relationship between the second conductor and the second region is substantially identical to the physical relationship between the first conductor and the second region.

4. The transistor layout as claimed in claim 1, wherein:

the second conductor physically is situated near the second region such that the created capacitance is formed between a surface of the second region and the second conductor;

the first conductor is arranged to receive one polarity of a differential input signal; and the second conductor is arranged to receive the other polarity of the differential input signal.

5. A transistor layout comprising:

a substrate of a first doping type;

a first field effect transistor (FET) including first and second regions of a second doping type physically located laterally adjacent, and slightly displaced from, one another in the substrate, one of the first and second regions serving as a source of the first FET and the other of the first and second regions serving as a drain of the first FET, and a first conductor serving as a gate of the first FET, wherein a first parasitic capacitance is formed between the first conductor and the second region due to a physical relationship therebetween;

a second FET including third and fourth regions of the second doping type physically located laterally adjacent, and slightly displaced from, one another in the substrate, the third region physically being located laterally adjacent, and slightly displaced from, the second region of the first FET, one of the third and fourth regions serving as a source of the second FET and the other of the third and fourth regions serving as a drain of the second FET, and a second conductor serving as a gate of the second FET, wherein a second parasitic capacitance is formed between the second conductor and the third region due to a physical relationship therebetween;

a third FET including the fourth region and a fifth region of the second doping type physically located laterally adjacent, and slightly displaced from, one another in the substrate, one of the fourth and fifth regions serving as a source of the third FET and the other of the fourth and fifth regions serving as a drain of the third FET, and a third conductor serving as a gate of the third FET, wherein a third parasitic capacitance is formed between the third conductor and the fifth region due to the physical relationship therebetween;

a fourth FET including sixth and seventh regions of the second doping type physically located laterally adjacent, and slightly displaced from, one another in the substrate, the sixth region physically being located laterally adjacent, and slightly displaced from, the fifth region of the third FET, one of the sixth and seventh regions serving as a source of the fourth FET and the other of the sixth and seventh regions serving as a drain of the fourth FET, and a fourth conductor serving as a gate of the fourth FET, wherein a fourth parasitic capacitance is formed between the fourth conductor and the sixth region due to the physical relationship therebetween;

a fifth conductor physically situated in close enough proximity to the second and third regions such that a first created capacitance is formed between the fifth conductor and the second region and a second created capacitance is formed between the fifth conductor and the third region, the fifth conductor not arranged in the layout so as to serve as a gate of an FET; and a sixth conductor physically situated in close enough proximity to the fifth and sixth regions such that a third created capacitance is formed between the sixth conductor and the fifth region and a fourth created capacitance is formed between the sixth conductor and the sixth region, the sixth conductor not arranged in the layout so as to serve as a gate of an FET;

wherein a total of the first and second created capacitances approximately matches a total of the third and fourth parasitic capacitances, and a total of the third and fourth created capacitances approximately matches a total of the first and second parasitic capacitances.

6. The transistor layout as claimed in claim 5, wherein the first, second, third and fourth FETs are in a first layout, and the transistor layout further comprises fifth, sixth, seventh and eighth FETs in a second layout that is similar to yet mirrored from the first layout about an axis of symmetry, wherein the seventh region is shared between the fourth and fifth FETs.

7. The transistor layout as claimed in claim 5, wherein the first, fourth, and seventh regions are coupled together, the second and third regions are coupled together, the fifth and sixth regions are coupled together, the first, second and sixth conductors are coupled together, and the third, fourth and fifth conductors are coupled together.

8. The transistor layout as claimed in claim 7, wherein the second and third regions form a drain node of a first single FET of a differential pair of FETs, the fifth and sixth regions form a drain node of a second FET of the differential pair of FETs, the first and second conductors form a gate node of the first single FET, the third and fourth conductors form a gate node of the second single FET, and the first, fourth, and seventh regions form a common-source node of the first and second single FETs.

9. The transistor layout as claimed in claim 8, further comprising a current source coupled to the common-source node to drive the differential pair of FETs.

10. The transistor layout as claimed in claim 8, further comprising a first current source coupled to the drain node of the first single FET and a second current source coupled to the drain node of the second single FET.

11. A transistor layout, comprising:
a substrate of a first doping type;
a first field effect transistor (FET) including
first and second regions of a second doping type physically located laterally adjacent, and slightly displaced from, one another in the substrate, one of the first and second regions serving as a source of the first FET and the other of the first and second regions serving as a drain of the first FET, and
a first conductor serving as a gate of the first FET, wherein a first parasitic capacitance is formed between the first conductor and the second region due to a physical relationship therebetween;
a second FET including
third and fourth regions of the second doping type physically located laterally adjacent, and slightly displaced from, one another in the substrate, the third region physically being located laterally adjacent, and slightly displaced from, the second region of the first FET, one of the third and fourth regions serving as a source of the second FET and the other of the third and fourth regions serving as a drain of the second FET, and
a second conductor serving as a gate of the second FET, wherein a second parasitic capacitance is formed between the second conductor and the third region due to the physical relationship therebetween; and
a third conductor physically situated in close enough proximity to the second and third regions such that a first created capacitance is formed between the third conductor and the second region and a second created capacitance is formed between the third conductor and the third region, the third conductor not arranged in the layout so as to serve as a gate of an FET;
wherein the transistor layout has a particular parasitic capacitance including the first parasitic capacitance and the second parasitic capacitance and a particular created capacitance including the first created capacitance and the second created capacitance, and wherein the particular parasitic capacitance approximately matches the particular created capacitance.

12. The transistor layout as claimed in claim 11, wherein a total of the first parasitic capacitance and the second parasitic capacitance approximately matches a total of the first created capacitance and the second created capacitance.

13. The transistor layout as claimed in claim 11, wherein the first region is coupled to the fourth region, the second region is coupled to the third region, and the first conductor is coupled to the second conductor.

14. The transistor layout as claimed in claim 13, wherein the first and fourth regions form a source node of a single FET, the second and third regions form a drain node of the single FET and the first and second conductors form a gate node of the single FET.

15. A transistor layout comprising:
a field effect transistor (FET) including a plurality of FET sections, each of the FET sections including a source, a drain and a gate, the sources of the FET sections being coupled together, the drains of the FET sections being coupled together, and the gates of the FET sections being coupled together, wherein the drains of the FET sections are physically located laterally adjacent, and slightly spaced from, one another, and
a conductor, which does not serve as a gate of an FET, physically situated in close enough proximity to the drains such that a created capacitance is formed between the conductor and the drains that approximately matches a parasitic capacitance present between the gates and the drains.

16. A method of creating a first capacitance to match a parasitic capacitance formed between a gate and one of a drain and a source of a field effect transistor (FET), comprising the steps of:
disposing an FET on a substrate; and
physically situating a conductor, which is physically distinct from the gate of the FET and which does not serve as a gate of an FET, in close enough proximity to the one of the drain and the source of the FET such that the first capacitance is created between the conductor and the one of the drain and the source of the FET so as to approximately match the parasitic capacitance.

17. A method of creating a capacitance with a drain node of a field effect transistor (FET), comprising the steps of:
physically arranging a plurality of FETs having source nodes, drain nodes and gate nodes on a substrate such that the drain nodes of the FETs are physically placed laterally adjacent, and slightly displaced from, one another; and
physically situating a conductor, which is physically distinct from the gates of the plurality of FETs and which does not serve as a gate of an FET, in close enough proximity to the drain nodes of the FETs such that a capacitance is formed between the conductor and the drain nodes that approximately matches a total parasitic capacitance present between the gate nodes and the drain nodes of the FETs.

18. A transistor layout, comprising:
a substrate of a first doping type;
a first field effect transistor (FET) including
first and second regions of a second doping type physically located laterally adjacent, and slightly displaced from, one another in the substrate, one of the first and second regions serving as a source of the first FET and the other of the first and second regions serving as a drain of the first FET, and a first conductor, serving as a gate of the first FET, arranged to receive one polarity of a differential input signal; and a second conductor physically situated in close enough proximity to the second region such that a created capacitance is formed between a surface of the second region and the second conductor, the second conductor being arranged to receive the other polarity of the differential input signal, the second conductor not being arranged in the layout to itself serve as a gate of an FET.

19. The transistor layout as claimed in claim 18, wherein the second conductor physically is situated near the second region such that a physical relationship between the second conductor and the second region is substantially identical to a physical relationship between the first conductor and the second region.

20. A transistor layout, comprising:

a substrate of a first doping type;

a first field effect transistor (FET) including first and second regions of a second doping type physically located laterally adjacent, and slightly displaced from, one another in the substrate, one of the first and second regions serving as a source of the first FET and the other of the first and second regions serving as a drain of the first FET, and a first conductor serving as a gate of the first FET; and a second conductor physically situated near the second region such that a physical relationship between the second conductor and the second region is substantially identical to a physical relationship between the first conductor and the second region, the second conductor not being arranged in the layout to serve as a gate of an FET.

* * * * *